United States Patent [19]
Asada et al.

[11] Patent Number: 5,894,185
[45] Date of Patent: Apr. 13, 1999

[54] PIEZOELECTRIC TRANSFORMER

[75] Inventors: Takaaki Asada, Moriyama; Hideya Horiuchi, Kyoto; Akiteru Takatsuka, Yokaichi; Michio Kadota, Kyoto, all of Japan

[73] Assignee: Murata Manufacturing Co., Ltd., Kyoto, Japan, JPX

[21] Appl. No.: 08/714,822

[22] Filed: Sep. 17, 1996

[30] Foreign Application Priority Data

Sep. 18, 1995 [JP] Japan ................................. 7-238348

[51] Int. Cl.$^6$ ................................................ H01L 41/04

[52] U.S. Cl. ........................ 310/368; 310/348; 310/366

[58] Field of Search ................................. 310/311, 328, 310/359, 348, 366, 368, 358

[56] References Cited

U.S. PATENT DOCUMENTS

| | | | |
|---|---|---|---|
| 3,660,699 | 5/1972 | Sakurai et al. | 310/326 |
| 4,641,055 | 2/1987 | Tanaka | 310/368 |
| 5,440,195 | 8/1995 | Ohnishi et al. | 310/359 |
| 5,648,746 | 7/1997 | Kaida | 333/189 |

*Primary Examiner*—Mark O. Budd
*Assistant Examiner*—Timothy A. Williams
*Attorney, Agent, or Firm*—Graham & James LLP

[57] ABSTRACT

A piezoelectric transformer includes a piezoelectric plate in which a pair of cuts are formed in the piezoelectric plate at a position corresponding to a nodal point of the piezoelectric plate. The pair of cuts form a cut-out projection. Connection electrodes electrically connected to input electrodes are respectively formed on input-side cut-out projections. In this piezoelectric transformer, the desired support and electrical connection are made through the cut-out projections.

20 Claims, 7 Drawing Sheets

RATIO OF THE DEPTH OF CUTS TO
THE WIDTH OF RECESSED PROJECTIONS

RATIO OF THE DEPTH OF CUTS TO
THE WIDTH OF RECESSED PROJECTIONS

PIEZOELECTRIC TRANSFORMER

BACKGROUND OF THE INVENTION

1. Field of the Invention

The present invention relates to a piezoelectric transformer preferably for use in an inverter for a liquid crystal display back light, in an inverter for lighting a fluorescent lamp, or in a high-voltage power supply circuit for copying machines or the like.

2. Description of the Related Art

A conventional piezoelectric transformer is constructed as shown in FIG. 8. FIG. 8 is a diagram showing an external appearance, input/output configurations and a vibrating form of the piezoelectric transformer vibrating in the secondary vibration mode of longitudinal vibration ordinarily called $\lambda$ mode. The resonance wavelength of the longitudinal vibration used is hereinafter referred to as $\lambda$.

This piezoelectric transformer includes a flat rectangular piezoelectric plate 1 having a length of $\lambda$ and formed of a piezoelectric ceramic. Input electrodes 2a and 2b are disposed on opposite positions on two major surfaces of one of two halves of the piezoelectric plate 1 bisected along the width direction of the piezoelectric plate 1. An output electrode 3 is formed on one end surface of the other half of the piezoelectric plate 1, the electrode 3 extending along the width of the plate 1. The half of the piezoelectric plate 1 which forms an input section is polarized in the direction of thickness of the plate 1, as indicated by arrow P1, while the other half of the piezoelectric plate 1 forming an output section is polarized in the longitudinal direction, as indicated by arrow P2.

This piezoelectric transformer vibrates so that, as shown in the lower section of FIG. 8, a nodal point at which the vibration displacement is zero is located at a distance corresponding to ¼ of the length of the piezoelectric plate 1 ($\lambda$/4) from each of the lengthwise opposite ends of the piezoelectric plate 1 while the vibration displacement is maximized at the opposite ends.

This piezoelectric transformer is fixedly supported at positions corresponding to the nodal points, and input wirings 4a and 4b are respectively connected to the input electrodes 2a and 2b at positions corresponding to the nodal point while an output wiring 5 is connected to the output electrode 3. The input wiring 4b functions as an input-output common terminal (grounding electrode). An input voltage is applied between the input electrodes 2a and 2b through the input wirings 4a and 4b, and an output voltage generated by the piezoelectric effect and the reverse piezoelectric effect is output through the output electrode 3 and the output wiring 5. Lead wires or the like are used as wirings 4a, 4b, and 5 for connection to external circuits by being connected to the input electrodes 2a and 2b and the output electrode 3 by soldering.

The connection of the input wirings 4a and 4b may be made at any position as long as the connection position corresponds to the nodal point. It may be such that portions of the input electrodes 2a and 2b are formed on the side surfaces perpendicular to the widthwise direction as connection electrodes electrically connected to the input electrodes 2a and 2b, and the input wirings 4a and 4b are connected to the connection electrodes at positions on these side surfaces corresponding to the nodal point.

If the fundamental (primary) vibration mode commonly referred to as the $\lambda$/2 mode (not shown) is used, a nodal point occurs at the position corresponding to ½ of the length of the piezoelectric plate 1 ($\lambda$/2) in the lengthwise direction and the vibration displacement is maximized at the opposite ends of the piezoelectric plate 1. In the tertiary (3$\lambda$/2) vibration modes or other higher-order vibration modes, a nodal point exists at the center of each $\lambda$/2 section and the vibration displacement is maximized at the opposite ends and at the positions corresponding to integer multiples of $\lambda$/2 from the opposite ends of the piezoelectric plate.

In the above-described piezoelectric transformer, the piezoelectric plate is ordinarily supported at positions corresponding to locations of nodal points at which the displacement caused by vibration is minimum. Electrical connection between the input electrodes and an external circuit is also made at a position corresponding to a location of a nodal point in order to avoid any impediment to vibration and to prevent disconnection of lead wires or the like due to vibration. Also, input wiring connections are made at positions on the side surfaces corresponding to a location of a nodal point for the purpose of reducing the overall thickness of the piezoelectric transformer.

At a nodal point, however, the vibration stress is maximum while the vibration displacement is minimum. Therefore, even though the piezoelectric plate is supported on a supporting member or electrical connection by soldering at a nodal point in the abovedescribed conventional piezoelectric transformer, the state of bonding or joining to the supporting member or the soldered state of lead wires or the like is liable to deteriorate, so that the reliability of supporting the piezoelectric plate and of the various electrical connections to the piezoelectric plate is low.

For stable support and practical mounting, support or electrical connection is ordinarily made in the vicinity of widthwise opposite ends or on side surface portions corresponding to a location of a nodal point. In such a case, however, vibration in the widthwise direction is limited so that a deterioration in performance, i.e., a reduction in step-up ratio or the like, results, or the reliability of electrical connection is reduced by a vibration stress in the lead wires or the like due to the widthwise vibration displacement.

SUMMARY OF THE INVENTION

To overcome the above-described problems of the conventional piezoelectric transformer, the preferred embodiments of the present invention provide a piezoelectric transformer which has cuts formed in opposite end portions corresponding to a location of a nodal point to form cut-out projections at which the vibration stress and the vibration displacement are largely reduced, support and electrical connection can be made at the cut-out portions with improved reliability while maintaining the desired performance and reducing the size of the transformer.

According to a first preferred embodiment of the present invention, there is provided a piezoelectric transformer vibrating in a longitudinal vibration mode and comprising a substantially rectangular piezoelectric plate having an input electrode and an output electrode disposed thereon, wherein a pair of cuts are formed at at least one location along a side portion of the piezoelectric plate in the vicinity of a nodal point of the piezoelectric plate, the pair of cuts defining a cut-out projection.

In the above-described piezoelectric transformer, a connection electrode electrically connected to one of the input electrode and the output electrode may be formed on the cut-out projection.

In the piezoelectric transformer arranged as described above, a supporting member for supporting the piezoelectric transformed on a mount member may be attached to the cut-out projection.

In the piezoelectric transformer arranged as described above, the supporting member may have a function for supporting the piezoelectric transformer on the mount member and a function for electrical connection.

According to the preferred embodiments of the present invention as described above, the vibration stress and the widthwise vibration displacement at the cut-out projection are largely reduced because of the cuts disposed on the opposite sides of the cut-out projection. Therefore, stable and reliable support and electrical connection is achieved at the cut-out projection without reducing the desired performance of the piezoelectric transducer.

The resonance frequency is reduced if cuts are formed in the widthwise direction of the piezoelectric plate. The piezoelectric transformer can therefore be reduced in size. That is, if the operating frequency is fixed, the length of the piezoelectric plate can be reduced.

Electrical connection can be made at a desired position on the cut-out projection by forming on the cut-out projection a connection conductor which is electrically connected to the input electrode or the output electrode. Therefore, a connection having improved reliability can be achieved and the connection arrangement can be adapted to various mount forms.

An arrangement capable of surface mounting can be provided by attaching a supporting member having both a supporting function and an electrical connection function to the cut-out projection. In this manner, the mounting facility is improved and stable and reliable support and electrical connection are achieved.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
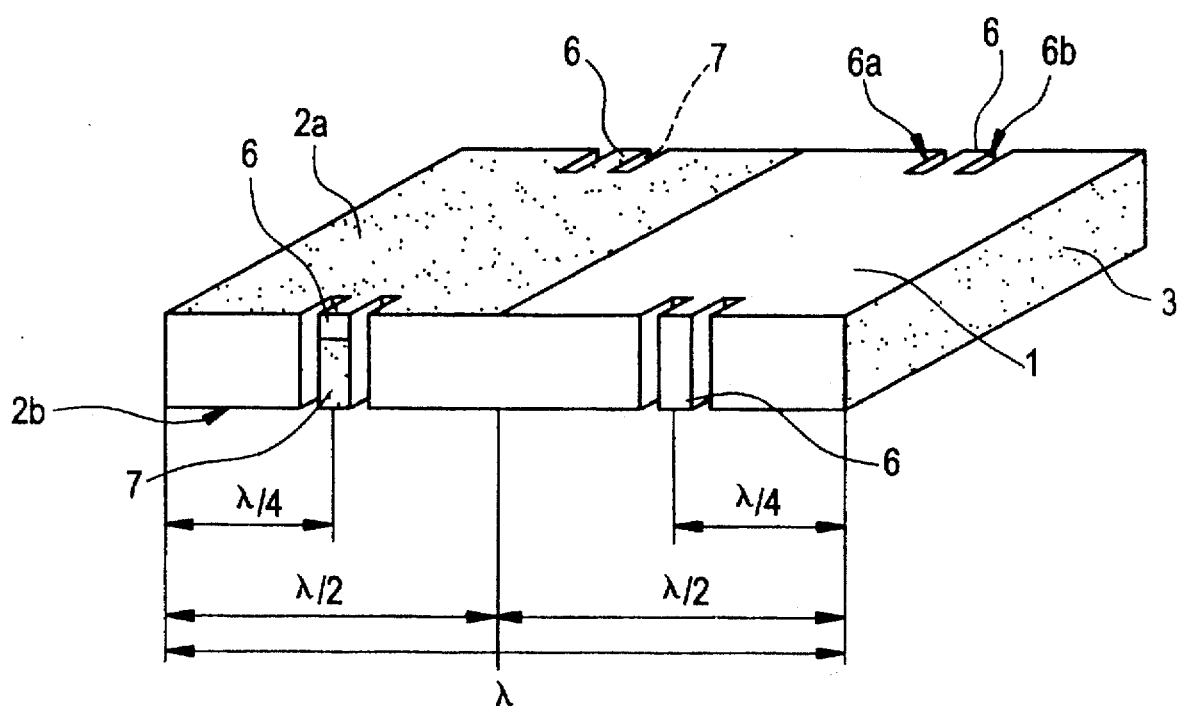
FIG. 1 is a external perspective view of a piezoelectric transformer which represents a first preferred embodiment of the present invention.

Preferred embodiments of the present invention will be described below with reference to the accompanying drawings.

In the drawings illustrating the preferred embodiments of the present invention, portions identical or corresponding to or having the same functions as those in the conventional arrangement are indicated by the same reference characters.

Figure 8:
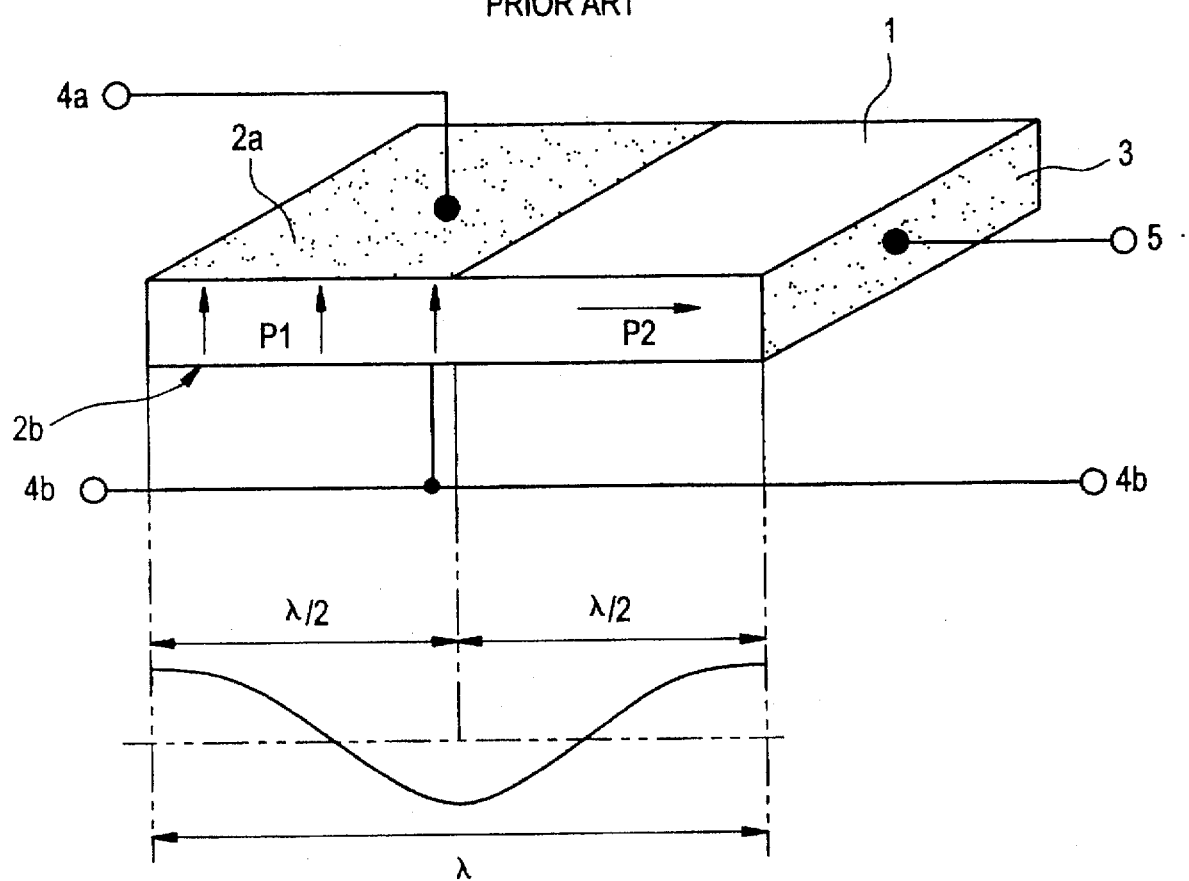
FIG. 8 is a schematic diagram showing an external appearance and a vibrating form of a conventional piezoelectric transformer.

FIG. 1 is a diagram showing the construction of a piezoelectric transformer which represents a first preferred embodiment of the preferred embodiments of the present invention, i.e., an example of an application of the present invention to the conventional piezoelectric transformer shown in FIG. 8.

The piezoelectric transformer of this preferred embodiment preferably uses the secondary vibration mode. As shown in FIG. 1, the piezoelectric transformer includes a piezoelectric plate 1 having pairs of cuts 6a and 6b preferably formed in widthwise opposite end portions in each of two sections, each of which is preferably $\lambda/2$ long in the lengthwise direction. The cuts 6a and 6b are preferably located at positions corresponding to a nodal point at a center portion of each of the $\lambda/2$ long sections, i.e., at a distance of about $\lambda/4$ from the corresponding one of the opposite ends, thereby forming cut-out projections 6. That is, a cut-out projection 6 is preferably formed in each of the side portions (four places) corresponding to positions of nodal points of the piezoelectric plate 1. A connection conductor 7 electrically connected to an input electrode 2a is preferably formed on one of the two cut-out projections 6 on the input side while another connection conductor 7 electrically connected to an input electrode 2b is preferably formed on the other cut-out projection 6 on the input side. The construction of this preferred embodiment is the same as that of the conventional piezoelectric transformer described above with reference to FIG. 8 except for the cut-out projections 6 defined by the cuts 6a, 6b and the connection conductors 7, and the description for the same components or portions will not be repeated.

The cuts 6a and 6b are preferably formed by a dicer or the like. In a specific preferred embodiment, the width of each of the cuts 6a and 6b may be ordinarily set to about 0.1 to 1 mm. Practically, the width of each cut-out projection 6 is preferably set to about 0.5 mm or more considering the use of the cut-out projection 6 for support and electrical connection.

The position of each cut-out projection 6 in the lengthwise direction is not limited to a theoretical (geometrical) nodal point; cut-out projections 6 may be formed at nodal point positions in actually-manufactured articles, which vary depending upon the supporting and electrical connection methods.

In the above-described arrangement, the vibration stress and the widthwise vibration displacement are largely reduced at the locations of the cut-out projections, and the piezoelectric plate is supported through the cut-out projections and electrical connection is also made at the cut-out projections, so that a deterioration in the state of bonding or joining to supporting members and a deterioration of soldered portions or the like for the electrical connection can be prevented without impeding the vibration. Thus, stable and reliable support and electrical connection is achieved.

Moreover, the resonance frequency is reduced due to the formation of the cuts in the widthwise direction. Therefore, the piezoelectric transformer can be reduced in size.

Since the connection conductors are preferably formed on the extreme end surfaces of the cut-out projections, electrical connection can also be made on the extreme end surfaces as well as on the upper and lower surfaces of the cut-out projections.

Figure 2:
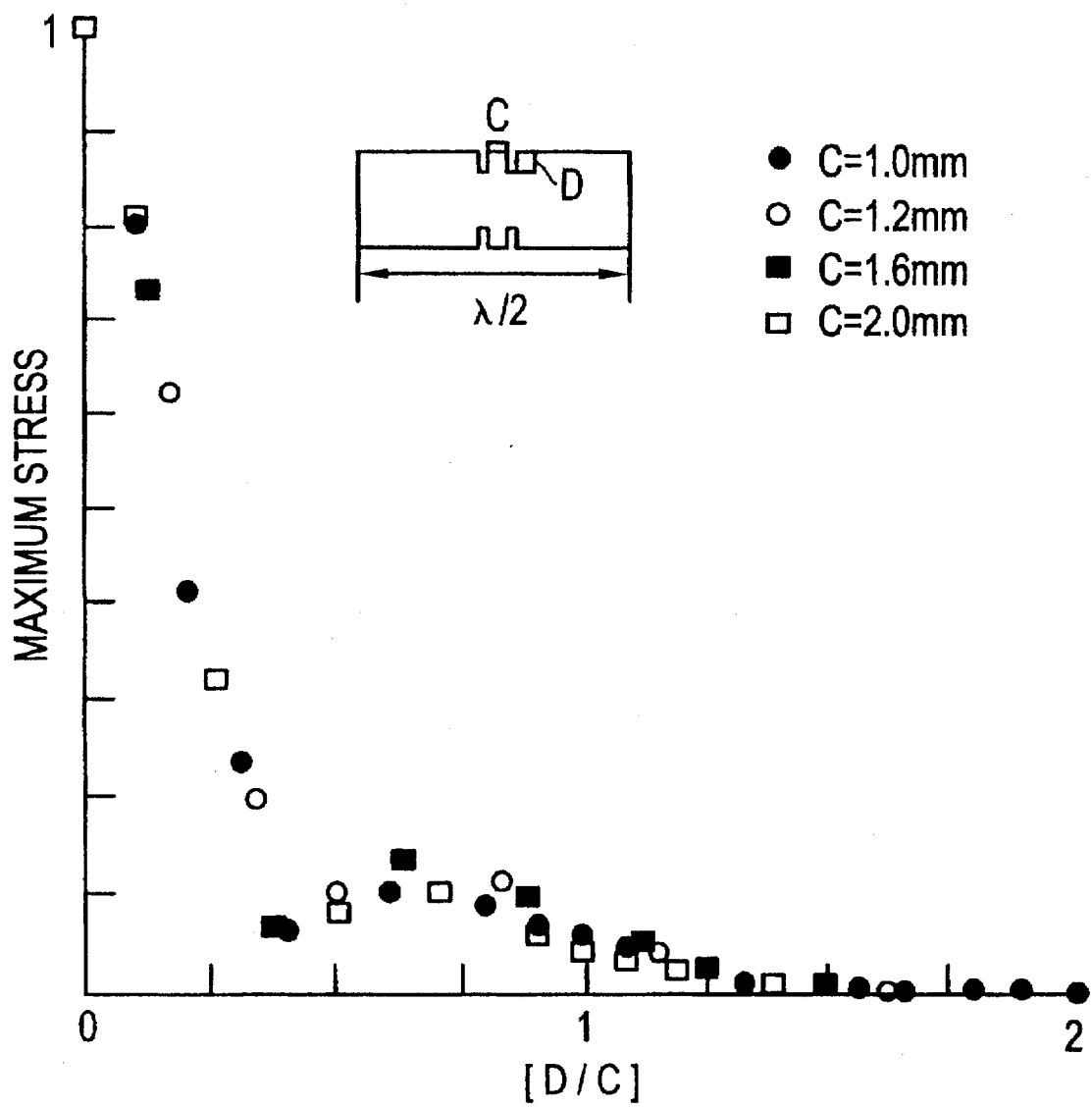
FIG. 2 is a graph showing the relationship between the size of a cut-out projection and the maximum stress in an extreme end portion of the cut-out projection in an experiment in accordance with the preferred embodiments of the present invention.
Figure 3:
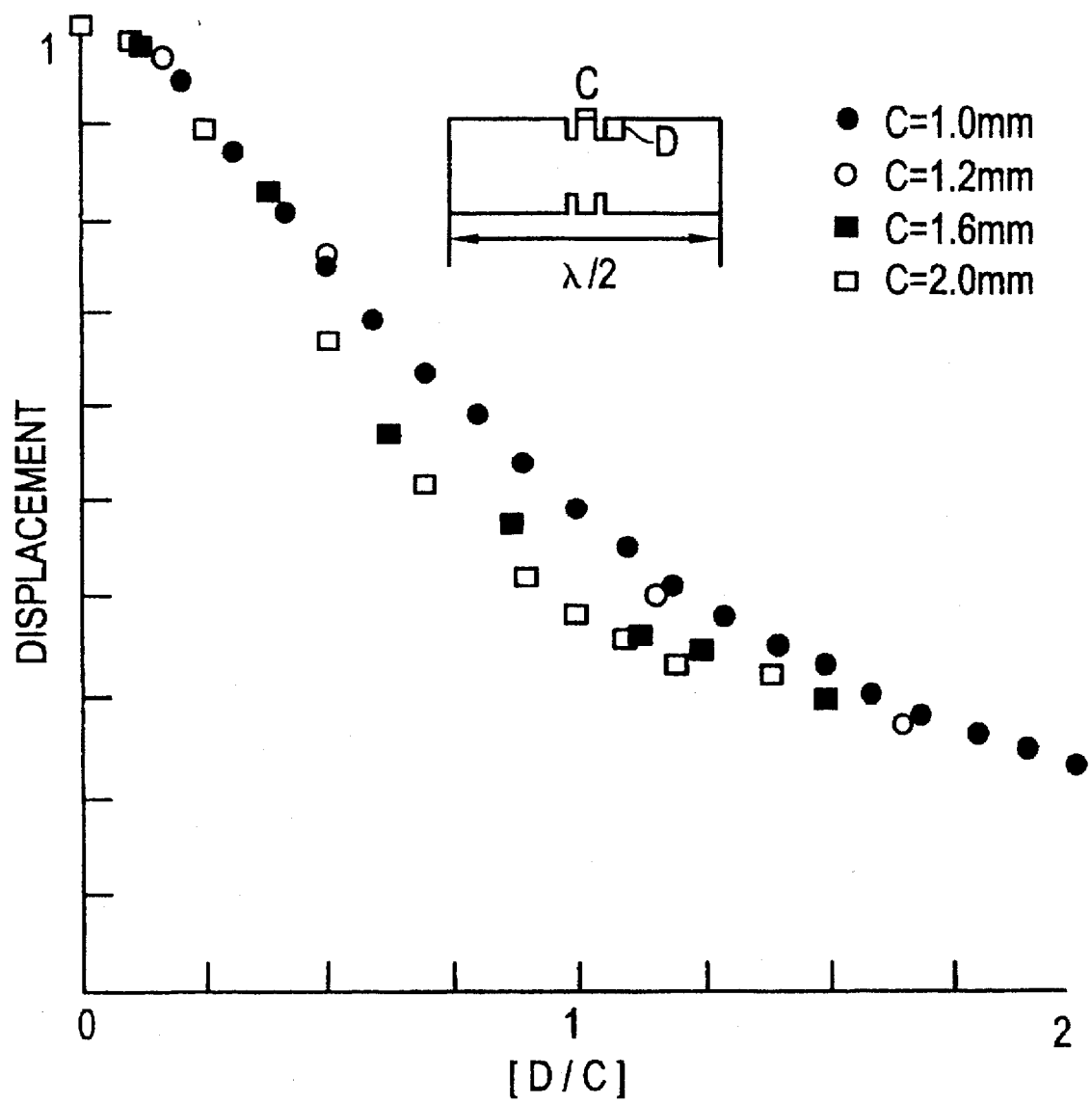
FIG. 3 is a graph showing the relationship between the size of the cut-out projection and the widthwise displacement of the extreme end portion of the cut-out projection in the experiment in accordance with the preferred embodiments of the present invention.
Figure 4:
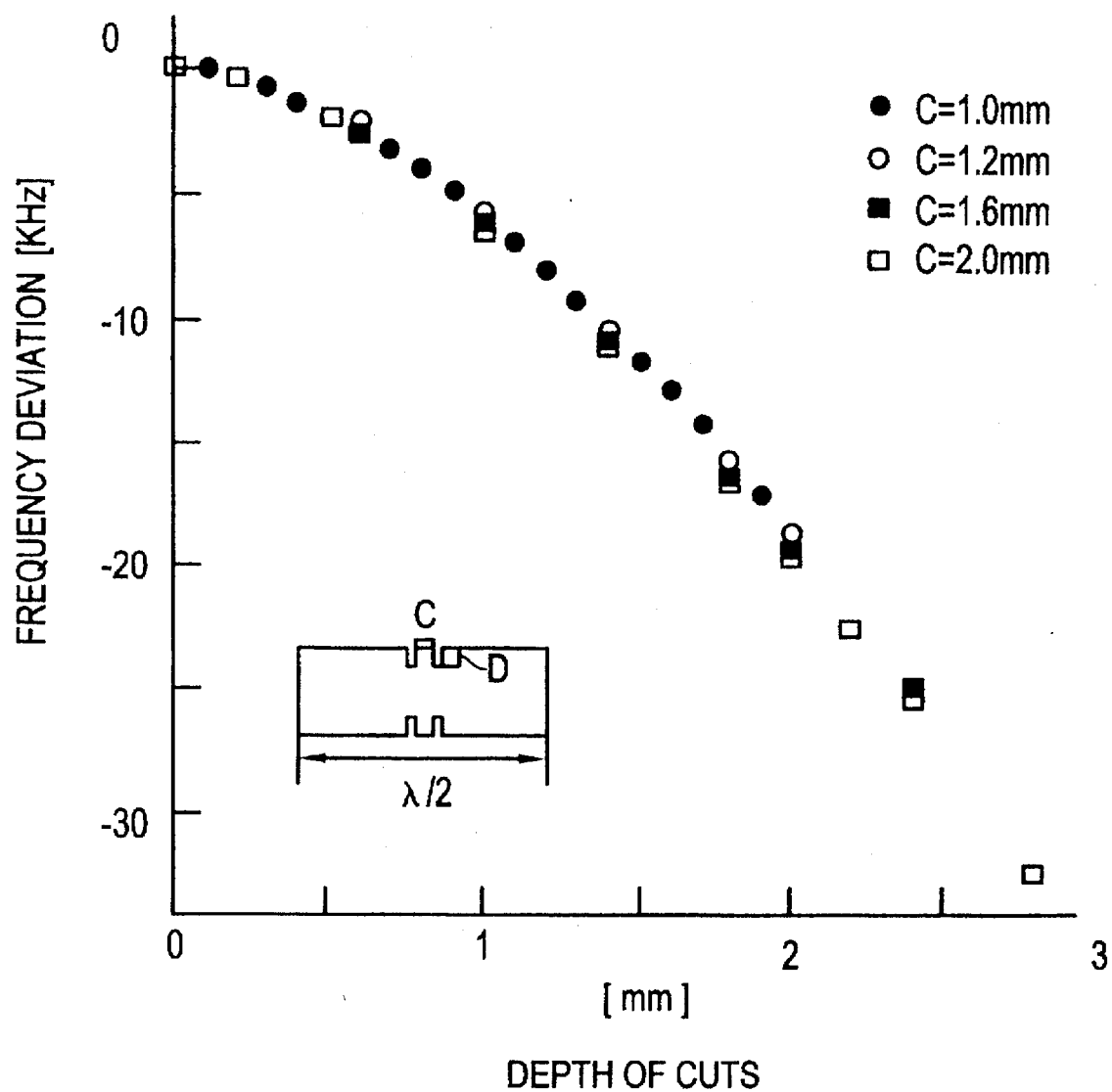
FIG. 4 is a graph showing the relationship between the resonance frequency and the depth of cuts in the experiment in accordance with the preferred embodiments of the present invention.

The effect and advantage of the cuts which have been confirmed via experimentation will now be described. An experiment was made by using a piezoelectric plate adapted to vibrate in the primary (fundamental) vibration mode and having a length ($\lambda/2$) of 17 mm (with respect to a frequency of about 90 KHz), a width of 8 mm and a cut width of 0.2 mm. FIGS. 2 through 4 are graphs showing changes in stress, displacement and resonance frequency when the width C of cut-out projections and the depth D of cuts were changed.

FIG. 2 shows the relationship between the maximum stress in a side end portion of the cut-out projections and the ratio D/C of the depth D of the cuts to the width C of the cut-out projection, FIG. 3 shows the relationship between the displacement at the side endportion of the cut-out projections and the ratio D/C of the depth D of the cuts to the width C of the cut-out projection, and FIG. 4 shows the relationship between the change in resonance frequency or frequency deviation and the cut depth D. In FIGS. 2 and 3, each of the maximum stress and the displacement in a piezoelectric substrate where no cuts are formed, i.e., those of the conventional piezoelectric transformer, is assumed to be equal to 1, and the frequency deviation is equal to 0 in a piezoelectric substrate in which no cuts are formed, i.e., in the conventional piezoelectric transformer.

As shown in FIG. 2, the maximum stress is about 0.3 when the ratio D/C of the depth of the cuts to the width of the cut-out projection is about 0.25, and it decreases abruptly with respect to the range from 0 to 0.25 of the ratio D/C and decreases gently with respect to the range greater than 0.25.

As shown in FIG. 3, the rate at which the displacement decreases is lower than the rate at which the stress decreases. However, the displacement is reduced to 0.5 when the ratio D/C of the depth of the cuts to the width of the cut-out projection is about 1.0.

That is, the maximum stress is not considerably large in practice if the ratio D/C is not lower than 0.25. On the other hand, a target reduction in the displacement is 50% or less. Therefore, it is preferable to set the ratio D/C to 1.0 or higher. That is, it is preferable to set the depth D of the cuts to a value not smaller than the width C of the cut-out projection. An upper limit of the depth D of the cuts is set by considering the mechanical strength of the piezoelectric plate 1 and transmission of longitudinal vibration.

The resonance frequency depends largely upon the depth D of the cuts, as shown in FIG. 4. It becomes lower as the depth D is increased.

Examples of a support and an electrical connection for the piezoelectric transformer of the preferred embodiments of the present invention will next be described.

Figure 5A:
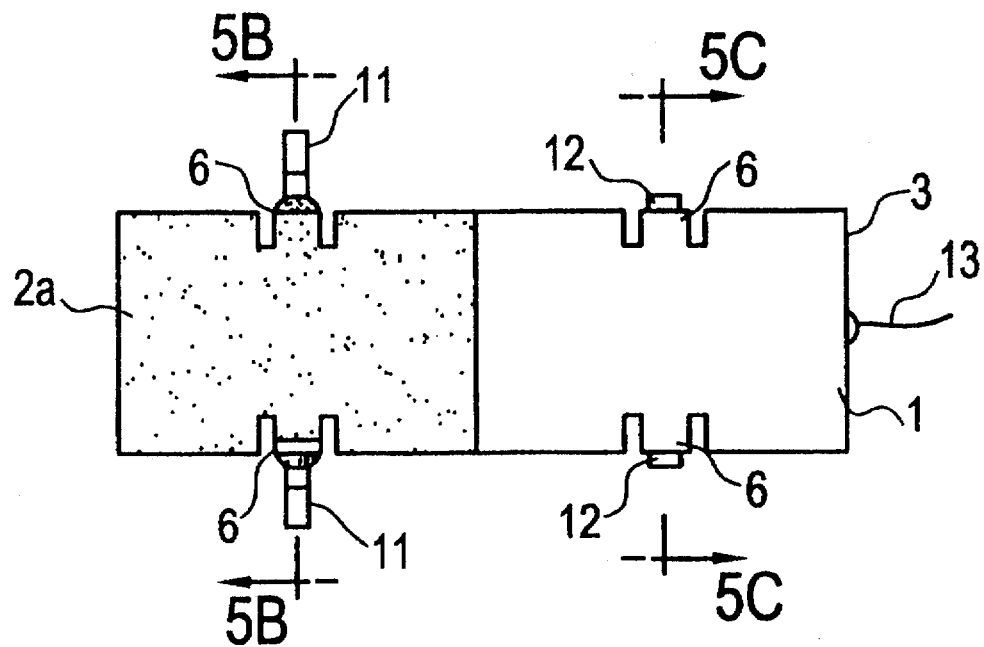
FIG. 5A is a plan view of a piezoelectric transformer which represents a second preferred embodiment of the present invention.
Figure 5B:
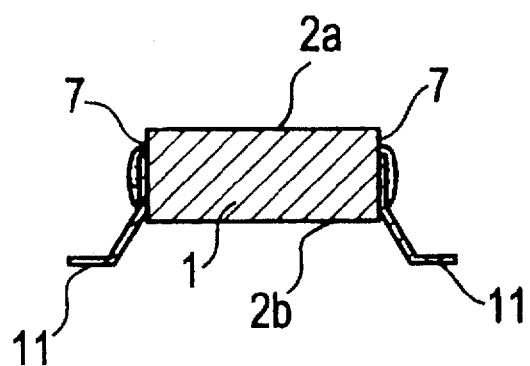
FIG. 5B is a cross-sectional view taken along the line X—X of FIG. 5A.
Figure 5C:
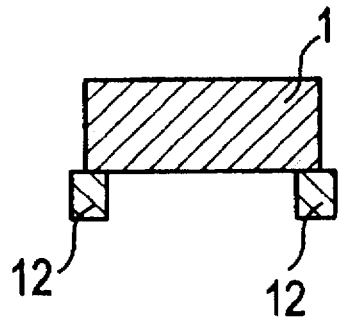
FIG. 5C is a cross-sectional view taken along the line Y—Y of FIG. 5A.

FIGS. 5A, 5B, and 5C show the construction of a piezoelectric transformer capable of being surface mounted in accordance with a second preferred embodiment of the present invention. FIG. 5A is a plan view, FIG. 5B is a cross-sectional view taken along the line X—X of FIG. 5A, and FIG. 5C is a cross-sectional view taken along the line Y—Y of FIG. A.

In the piezoelectric transformer of this preferred embodiment, a connection terminal 11 is preferably attached to each of connection conductors 7 disposed on extreme end surfaces of input-side cut-out projections 6 and electrically connected to input electrodes 2a and 2b while supporting blocks 12 are preferably attached to bottom surfaces (mounting surfaces) of output-side cut-out projections 6. An output lead wire 13 is attached to a substantially-central portion of an output electrode 3. The construction of this piezoelectric transformer preferably is the same as that of the first preferred embodiment shown in FIG. 1 except for these attached members 11 and 12, and the description for the other components or portions will not be repeated.

Each of the connection terminals 11 is preferably formed by being punched in a metallic plate and by being bent, and has one end portion connected and fixed to the connection conductor 7 by soldering, an electroconductive paste or the like. Each of the supporting blocks 12 is preferably made of an elastic material such as a ceramic, a resin or a rubber formed and worked into the shape of a cylinder or a rectangular prism, and is attached preferably by bonding with an adhesive. The lead wire 13 is connected preferably by being soldered. To increase the strength of attachment of the connection terminal 11, the connection between the connection terminal 11 and the connection conductor 7 may be reinforced with an adhesive.

The other ends of the connection terminals 11 and the lead wire 13 are preferably soldered to pads on wiring patterns formed on a mount member such as a mount substrate. The supporting blocks 12 are bonded and fixed to the mount member to function as a supporting member.

In this arrangement, the connection terminals 11 perform both a supporting function and an electrical connection function and comprise a supporting member. Because the connection terminals 11 and the supporting blocks 12 are attached to the cut-out projections, the influence of the vibration stress and displacement on the connection terminals 11 and the supporting blocks 12 is largely reduced, thus achieving stable and reliable support and electrical connection.

A member performing a supporting function and an electrical connection function which has the same shape as the above-described supporting block 12 and which has an electrode formed on a surface of the block-like body, or an electroconductive rubber member, may also be used. Also, a member having the same shape as the above-described connection terminal 11 and formed of a resin or the like may be used as a member performing a supporting function only.

Figure 6A:
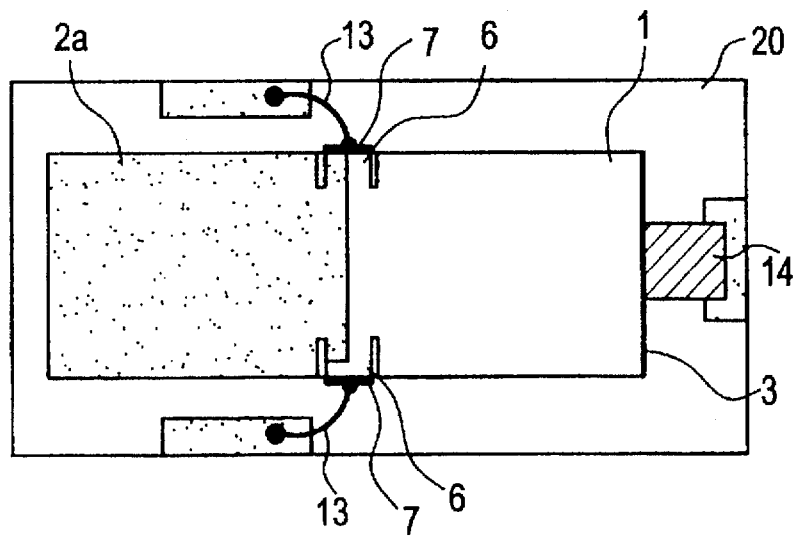
FIG. 6A is a plan view of a mount structure of a piezoelectric transformer which represents a third preferred embodiment of the present invention.
Figure 6B:
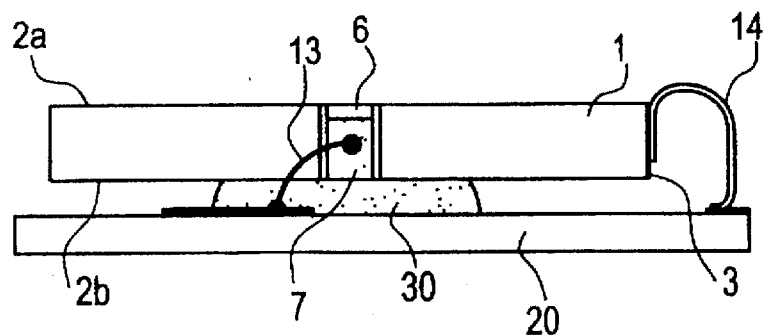
FIG. 6B is a side view of the piezoelectric transformer shown in FIG. 6A.

FIGS. 6A and 6B are diagrams showing a mount structure for a piezoelectric transformer in accordance with a third preferred embodiment of the present invention. FIG. 6A is a plan view and FIG. 6B is a side view.

The piezoelectric transformer of this preferred embodiment vibrates in the fundamental (primary) vibration mode and a piezoelectric plate 1 of this piezoelectric transformer preferably has cut-out projections 6 formed in two side portions at a central portion located along the lengthwise direction, corresponding to a location of a nodal point. A connection conductor 7 electrically connected to an input electrode 2a and another connection conductor 7 electrically connected to an input electrode 2b are preferably formed on extreme end surfaces of the cut-out projections 6.

As shown in FIG. 6B, the piezoelectric plate 1 is supported on a mount member 20 such as a mount substrate preferably by a rubber- or gel-like silicone adhesive 30, input lead wires 13 are respectively connected to the connection conductors 7 formed on the extreme end surfaces of the cut-out projections 6, and an output film-like conductor 14 is connected to an output electrode 3 formed on an output end surface by being soldered thereto or by being bonded with an electroconductive adhesive. The ends of the lead wires 13 and the film-like conductor 14 opposite from the above-mentioned connections are preferably connected to pads on wiring patterns formed on the mount member 20 by being soldered thereto or by being bonded with an electroconductive adhesive.

If the primary vibration mode is used, the method of supporting using a silicone adhesive as described above is effective in achieving stable support. If a film-like conductor is used for output electrical connection as described above, the vibration of the piezoelectric transformer is not restricted and occurrence of disconnection or the like due to the vibration displacement can be reduced.

In this arrangement, the input lead wires 13 are connected to the cut-out projections at which the stress and the widthwise displacement are markedly reduced, thereby preventing a reduction in the strength of the soldered connection to the lead wires 13 and a deterioration of the lead wires due to the widthwise vibration displacement.

The preferred embodiments of the present invention have been described with respect to a single-plate piezoelectric transformer vibrating in the primary or secondary vibration mode. However, the preferred embodiments of the present invention are also applicable to piezoelectric transformers having a laminated structure and to piezoelectric transformers using tertiary and other high-order vibration modes.

Figure 7:
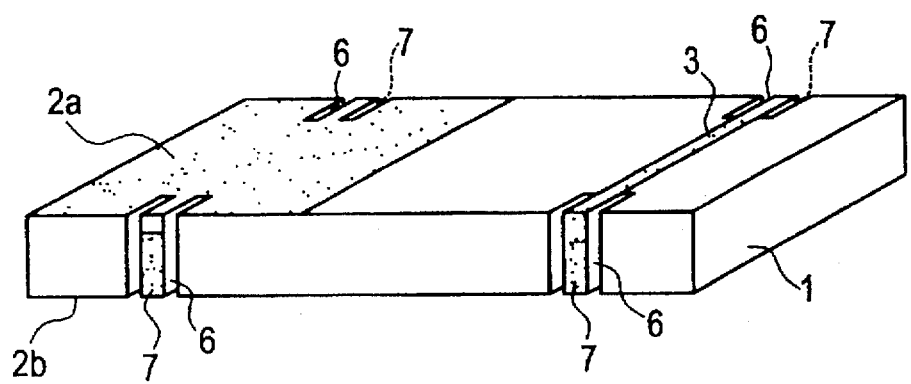
FIG. 7 is an external perspective view of a further preferred embodiment of the present invention.

FIG. 7 shows a piezoelectric transformer using the tertiary vibration mode. This piezoelectric transformer has cut-out projections 6 formed in opposite side portions at positions corresponding to locations of nodal points located $\lambda/4$ apart from the input and output ends. Output electrodes 3 in the form of strips are formed on the two major surfaces at a position $\lambda/4$ apart from the output-side lengthwise end, and connection conductors are formed on the extreme end surfaces of the corresponding cut-out projections 6 so as to connect the upper and lower output electrodes 3 to each other. No cut-out projection is provided at the position corresponding to the nodal point at the center in the lengthwise direction.

In this arrangement, support and electrical connection can be made at the output electrode 3 as well as at the input electrodes 2a and 2b by using a supporting member performing a supporting function and an electrical connection function. As in this arrangement, it is not always necessary to form cut-out projections at the positions corresponding to all the nodal points, and cut-out projections may be formed only at positions at which support and electrical connection should be made with improved stability and reliability.

In the above-described preferred embodiments, the cut-out projections are provided symmetrically at the opposite side portions at positions corresponding to a nodal point. However, this arrangement is not exclusively used; a cut-out projection may be formed in only one side portion with respect to one nodal point. Also, the pairs of cuts may have different depths.

Essentially, the number, the shape and the formed position of cut-out projections are selected as desired by considering the mounting form, the step-up ratio and other characteristics.

As described above, in the piezoelectric transformer of the preferred embodiments of the present invention, a cut-out projection at which the vibration stress and displacement are reduced is formed at a position corresponding to a nodal point in the lengthwise direction, and support and electrical connection are made through this cut-out projection, thereby achieving stable and reliable support and electrical connection without reducing the performance of the transformer.

The resonance frequency is reduced due to the formation of cuts in the widthwise direction, so that the size of the piezoelectric transformer can be reduced.

Electrical connection can be made at a desired position on the cut-out projection by forming on the cut-out projection a connection conductor electrically connected to an input electrode or an output electrode. Therefore, a connection having improved reliability can be achieved and the connection form can be adapted to various mount forms.

Further, an arrangement capable of being surface mounted can be provided by attaching a supporting member having both a supporting function and an electrical connection function to the cut-out projection. In this manner, the mounting facility is improved and stable and reliable support and electrical connection are achieved.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric transformer comprising:

a substantially rectangular piezoelectric plate having an input electrode and an output electrode disposed thereon;

wherein a pair of cuts are formed in a side portion of said piezoelectric plate in a vicinity of a position corresponding to a nodal point of said piezoelectric plate, said pair of cuts extending from an edge surface of said piezoelectric plate along a widthwise direction of said piezoelectric plate and having a depth less than one half of a width of said piezoelectric plate, the pair of cuts being located adjacent to each other so as to define a cut-out projection comprising a substantially rectangular portion surrounded on each of two sides by a recess formed by a respective one of said pair of cuts and having a third side which connects said two sides and extends so as to be flush with an outer edge surface of said piezoelectric plate.

2. A piezoelectric transformer according to claim 1, wherein a connection electrode electrically connected to one of said input electrode and said output electrode is disposed on said outer edge surface of said cut-out projection.

3. A piezoelectric transformer according to claim 1, further comprising a mount member and a supporting member for supporting said piezoelectric plate on said mount member, said supporting member being attached to said cut-out projection.

4. A piezoelectric transformer according to claim 3, wherein said supporting member is arranged to support said piezoelectric plate on said mount member and electrically connects said piezoelectric plate to said mount member.

5. A piezoelectric transformer according to claim 1, wherein said pair of cuts comprise a first pair of cuts and said cut-out projection comprises a first cut-out projection, said piezoelectric transformer further comprising a second pair of cuts formed in said piezoelectric plate defining a second cut-out projection.

6. A piezoelectric transformer according to claim 5, wherein said second pair of cuts and said second cut-out projection are disposed on said side portion of said piezoelectric plate where said first pair of cuts and said first cut-out projection are located.

7. A piezoelectric transformer according to claim 5, wherein said second pair of cuts and said second cut-out projection are located on a side of said piezoelectric plate that is opposite to said side portion where said first pair of cuts and said first cut-out projection are located.

8. A piezoelectric transformer according to claim 1, wherein said pair of cuts extend in a direction of a width of said piezoelectric plate.

9. A piezoelectric transformer according to claim 1, wherein said pair of cuts have equal lengths.

10. A piezoelectric transformer according to claim 1, wherein said pair of cuts do not have equal lengths.

11. A piezoelectric transformer according to claim 1, wherein said piezoelectric plate includes first and second major surfaces and a plurality of side edge surfaces connecting said first and second major surfaces, said input electrode being disposed on a portion of said first major surface and one of said side edge surfaces and said output electrode being disposed on a portion of said second major surface and one of said side edge surfaces.

12. A piezoelectric transformer comprising:

a piezoelectric plate having an input electrode and an output electrode disposed thereon;

at least one cut-out projection defined in said piezoelectric plate by a pair of adjacent cuts formed in a side of the piezoelectric plate, the cut-out projection member comprising a portion of the piezoelectric plate which is spaced from a remaining portion of the piezoelectric plate on three sides of the cut-out projection member and is integral with the remaining portion of the piezoelectric plate at a fourth side of the cut-out projection member.

13. A piezoelectric transformer according to claim 12, wherein a connection electrode electrically connected to one of said input electrode and said output electrode is disposed on said cut-out projection.

14. A piezoelectric transformer according to claim 12, further comprising a mount member and a supporting member for supporting said piezoelectric plate on said mount member, said supporting member being attached to said cut-out projection.

15. A piezoelectric transformer according to claim 14, wherein said supporting member is arranged to support said piezoelectric plate on said mount member and electrically connects said piezoelectric plate to said mount member.

16. A piezoelectric transformer according to claim 12, wherein said pair of cuts comprise a first pair of cuts and said cut-out projection comprises a first cut-out projection, said piezoelectric transformer further comprising a second pair of cuts formed in said piezoelectric plate defining a second cut-out projection.

17. A piezoelectric transformer comprising:

a piezoelectric plate having an input electrode and an output electrode disposed thereon;

at least one cut-out projection defined by a pair of adjacent cuts formed in the piezoelectric plate wherein the cut-out projection comprises a portion of said piezoelectric plate which is spaced at a first region of the cut-out projection from a remaining portion of said piezoelectric plate by spaces formed in said piezoelectric plate by said pair of cuts and is integral with the remaining portion of said piezoelectric plate at a second region of the cut-out projection.

18. A piezoelectric transformer according to claim 17, wherein said pair of cuts comprise a first pair of cuts and said cut-out projection comprises a first cut-out projection, said piezoelectric transformer further comprising a second pair of cuts formed in said piezoelectric plate defining a second cut-out projection.

19. A piezoelectric transformer according to claim 18, wherein said second pair of cuts and said second cut-out projection are disposed on said side portion of said piezoelectric plate where said first pair of cuts and said first cut-out projection are located.

20. A piezoelectric transformer according to claim 18, wherein said second pair of cuts and said second cut-out projection are located on a side of said piezoelectric plate that is opposite to said side portion where said first pair of cuts and said first cut-out projection are located.

* * * * *